(12) United States Patent
Kobayashi

(10) Patent No.: US 6,245,147 B1
(45) Date of Patent: *Jun. 12, 2001

(54) THERMAL PROCESSING JIG FOR USE IN MANUFACTURING SEMICONDUCTOR DEVICES AND METHOD OF MANUFACTURING THE SAME

(75) Inventor: Masanori Kobayashi, Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/134,332

(22) Filed: Aug. 14, 1998

(30) Foreign Application Priority Data

Dec. 16, 1997 (JP) .................................. 9-346732
May 3, 1998 (JP) .................................. 10-130695

(51) Int. Cl.$^7$ .................. C23C 16/00; B65D 85/00; B65D 85/30; B65D 85/48

(52) U.S. Cl. .................. 118/500; 118/715; 118/724; 118/725; 118/728; 206/710; 206/711; 206/832; 206/833

(58) Field of Search .................. 206/710, 711, 206/832, 833, 454; 118/715, 724, 725, 728, 729, 500; 266/256

(56) References Cited

U.S. PATENT DOCUMENTS

| 4,317,668 | 3/1982 | Suga . |
| 4,664,747 | 5/1987 | Sekiguchi et al. . |
| 4,830,982 | 5/1989 | Dentai et al. . |
| 5,119,761 | 6/1992 | Nakata . |
| 5,395,452 | 3/1995 | Kobayashi et al. . |
| 6,013,133 | * 1/2000 | Takashima et al. .................. 118/500 |

FOREIGN PATENT DOCUMENTS

| 0046 355 | 2/1982 | (EP) . |
| 55-126542 | 9/1980 | (JP) . |
| 58-168264 | 10/1983 | (JP) . |
| 60-27676 | * 2/1985 | (JP) . |
| 63-236723 | 10/1988 | (JP) . |
| 63-261728 | 10/1988 | (JP) . |
| 3-84922 | 4/1991 | (JP) . |
| 8-8203 | * 1/1996 | (JP) . |
| WO 88/05836 | 8/1988 | (WO) . |

* cited by examiner

*Primary Examiner*—Jeffrie R. Lund
(74) *Attorney, Agent, or Firm*—Armstrong, Westerman Hattori, McLeland & Naughton, LLP

(57) ABSTRACT

A thermal processing jig 1 made from quartz for use in manufacturing semiconductor devices is provided, which may effectively prevent deposition of contaminating metals on the semiconductor devices during heat treatments thereof, and a method of manufacturing such jig in the form having a good structure for fabrication. The thermal processing jig 1 is designed to support silicon wafers 2 during heat treatments thereof. The body of the jig is made from a first type of quartz 8 having high heat resistance such as electric fusion quartz, while those portions of the jig coming adjacent to said silicon wafers 2 are made from a second type of quartz 7 such as oxyhydrogen flame fusion quartz and synthetic quartz which contains only a small amount of metal impurities and does not liberate metal impurities appreciably during the heat treatments. Alternatively, the body of the thermal processing jig 1 may be made from highly refractory oxyhydrogen flame fusion quartz, while the section adjacent the silicon wafer 2 may be made from synthetic quartz containing less contaminating impurity metals. The silicon wafer 2 is separated from the electric fusion quartz and oxyhydrogen flame fusion quartz at a predetermined distance g.

10 Claims, 7 Drawing Sheets

THERMAL PROCESSING JIG WITH SILICON WAFERS WONTED THEREON

ENLARGE SECTIONAL VIEW OF THERMAL PROCESSING JIG SHOWING THE SECTION SUPPORTING A SILICON WAFER

FURNACE TUBE (Prior Art)

FURNACE TUBE (Prior Art)

THERMAL PROCESSING JIG (Prior Art)

THERMAL PROCESSING JIG (Prior Art)

THERMAL PROCESSING JIG

THERMAL PROCESSING JIG WITH SILICON WAFERS WONTED THEREON

ENLARGE SECTIONAL VIEW OF THERMAL PROCESSING JIG
SHOWING THE SECTION SUPPORTING A SILICON WAFER

ENLARGE SECTIONAL VIEW OF THERMAL PROCESSING JIG
SHOWING THE SECTION SUPPORTING A SILICON WAFER

A SECOND THERMAL PROCESSING JIG SUPPORTING
A SILICON WAFER AT TWO POINTS

7

2 silicon wafer 7 oxyhydrogen flame fusion quartz or synthetic quartz

8

2

8 electric fusion quartz 7
2
7

8
2
8

SAMPLE SPECIMENS FOR USE IN DETERMINING THE AMOUNTS OF METAL IMPURITIES LIBERATED FROM A QUARTZ

SAMPLE SPECIMENS FOR USE IN DETERMINING THE AMOUNTS OF
METAL IMPURITIES LIBERATED FROM A QUARTZ, WITH SPACES
BETWEEN THE BOTH

THERMAL PROCESSING JIG FOR USE IN MANUFACTURING SEMICONDUCTOR DEVICES AND METHOD OF MANUFACTURING THE SAME

FIELD OF THE INVENTION

The invention relates to a thermal processing jig for use in manufacturing semiconductor devices and a method of manufacturing such jig.

BACKGROUND OF THE INVENTION

As integrated circuit semiconductor devices acquire higher and higher circuit densities, extremely clean manufacturing environmental conditions are required to ensure that the semiconductor devices are free of contamination of impurity materials that cause imperfection and deterioration of the devices if introduced during manufacture of the devices. Such impurity metals for example include Fe, Cu, Cr, Ni, etc.

In particular, in the process of treating a semiconductor wafer at an elevated temperature, above 900° C. or more, say, if the wafer is exposed to an atmosphere that contains contaminating impurity metals, the wafer is likely to adsorb the metals on the surface thereof, which metals are eventually taken in by the wafer, becoming a source of imperfection of the wafer.

Accordingly, jigs for use in the thermal processing of semiconductor wafers must be made from clean or pure materials, so that the jigs will not emit impurity materials onto wafers while the wafers are exposed to the jigs at high temperatures.

Thus, in the thermal processing of a semiconductor wafer or substrate for growing a layer on the surface thereof for example, it is customary to use jigs made from high purity quartz ($SiO_2$) or high purity silicon carbide (SiC) which contains only negligible amount of impurity metals.

In the processes of growing a layer on the semiconductor wafer and in the heat treatment of the wafers, a furnace tube is often utilized, which consists of a quartz tube and a heater wound on the exterior of the quartz tube. For example, silicon wafers are placed on a quartz jig and the entire jig accommodating the silicon wafers are inserted in the furnace tube to thereby form oxidized layers on the wafers and/or to cause required impurities to be diffused in the substrates at high temperatures. Such a jig for the heat treatment is called a wafer boat.

Conventionally, such a furnace tube and a wafer boat as mentioned above are made from quartz since quartz is relatively easy to fabricate and not too expensive. For this purpose, a chunk of quartz is normally grown from fused quartz, which may be obtained from quartz powder by fusing it in mainly two different ways as described below:

(1) Fusing quartz powder by oxyhydrogen flame in a Bernoulli furnace; and (2) Fusing quartz powder in an electric furnace for vacuum fusion. The former method that uses oxyhydrogen flame is referred to as "oxyhydrogen flame fusion method", and the latter as "electric fusion method". Synthetic quartz or synthesis quartz which is grown epitaxially is also known. This quartz however, exhibits a disadvantageously large thermal deformation if it is heated to a temperature as high as 1000° C. in the furnace, so that it is not practical to use it for material of a furnace or a thermal processing jig.

The oxyhydrogen flame fusion quartz and electric fusion quartz are both made from the same natural resources such as silicate rock and silicate sands. Unfortunately, oxyhydrogen flame fusion quartz is inferior in heat resistance than electric fusion quartz and is likely to be deformed by heat when used in a thermal processing jig. This is due to the fact that oxyhydrogen flame fusion quartz is made from quartz powder by fusing it with oxyhydrogen flame, so that it contains a fairly large amount of OH radicals (as much as 100 ppm). On the other hand, electric fusion quartz, developed to overcome this disadvantage of oxyhydrogen flame fusion quartz, has a superior heat resistance, since it contains much less OH radicals (as much as 30 ppm) than the oxyhydrogen fusion quartz because the quartz powder is melted in a vacuum furnace. The heat resistance of quartz is strongly connected with the amount of OH radicals contained therein. The greater the number of OH radicals in quartz, the less heat resistance it has, and is therefore more deformable.

Detailed information on the heat resistance of quartz has been reported in various documents such as, for example, a book entitled "KOGYO ZAIRYOU", on July 1974 issued by NIKKAN KOUGYO SHINBUN and an article entitled "NEW GLASS FORUM", NEW GLASS, No. 14, 1987.

Because these two kinds of quartz are obtained from natural ores such as silica stone and silica sand, they contain relatively large amount of impurity metals. They cannot be regarded as "pure quartz". It is therefore necessary to prevent the impurities from being emitted from the quartz used in a thermal processing when the quartz is exposed to a high temperature during manufacture of semiconductor devices.

Japanese Patent Laid-Open Publication (KOKAI) Nos. SHO 55-126542 and HEI 3-84922 have disclosed use of vitreous quartz which is epitaxially synthesized and deposited on the inside of a cylinder made from electric fusion quartz and having high heat resistance. This arrangement is designed to prevent contaminants emitted, by means of a layer of the synthetic quartz, from the electric fusion quartz from reaching the silicon wafer placed in the cylinder.

Japanese Patent Laid-Open Publication (KOKAI) No. SHO 63-236723 discloses a combination of an electric fusion quartz tube and an outer layer which contains aluminum and is deposited on the exterior of the quartz tube for stopping the infiltration of impurities from outside of the tube.

The present inventors have disclosed in Japanese Patent Laid-Open Publication (KOKAI) No. HEI 6-69145 a furnace tube 19 as shown in FIGS. 1 and 2. The furnace tube 19 is provided on the exterior thereof with a winding heater 21 as seen in FIG. 1, and inside thereof with a thermal processing jig 11 made from quartz for supporting silicon wafers 12. The quartz jig 11 accommodating the semiconductor wafers 12 is placed in the furnace tube 19, where the wafers 12 are subjected to a thermal process to form, for example, an oxidized layer, or to diffuse required impurities into the wafer.

As shown in FIG. 1 as well as in FIG. 2A showing a radial cross section of the furnace tube 19, the furnace tube 19 includes a first layer 18 of heat resistive or refractory electric fusion quartz. The inner surface of the first layer 18 is covered with a second layer 17 of oxyhydrogen flame fusion quartz. This furnace tube 19 is designed to provide a major portion of the tube made from less deformable electric fusion quartz on one hand, and provide on the other hand a lining of less contaminating oxyhydrogen flame fusion quartz on the inner surface of the tube facing the silicon wafer 12, so that metal impurities liberated from the electric fusion quartz will be stopped by the oxyhydrogen flame fusion quartz.

The above mentioned Japanese Laid-Open Publication discloses a similar furnace tube 19 further having a third layer 20 of synthetic quartz which is epitaxially grown between the first layer 18 and the second layer 17, as shown in FIG. 2B. The third layer 20 is intended to reinforce the function of the second layer 17.

The present inventors have proposed in the foregoing Laid-Open Publication an alternative thermal processing jig or wafer boat 11 made from quartz as shown in FIGS. 3 and 4. This thermal processing jig is also indicated by the same reference numeral 11 as the jig disposed in the furnace tube 19 shown in FIG. 1.

In this thermal processing jig 11, the entire surface of the heat resistive electric fusion quartz (first layer) 18 is covered with an oxyhydrogen flame fusion quartz (second layer) 17, as shown in FIG. 3 and in FIGS. 4A and 4B in cross section.

A still further alternative has been discussed in the above Laid-Open Publication, in which a first layer 18 and a second layer 17 respectively, are intervened by a third synthetic quartz layer, as shown in FIGS. 4B and 4D. The third layer 20 is provided to enhance the function of the second layer 17.

The prior art furnace tube mentioned above has a rather simple configuration consisting of a generally hollow cylinder with one end thereof closed, so that it may be fabricated without any problem. It has been known that such configuration of the furnace tube 19 may effectively prevent deposition of contaminating metals from the furnace tube during heat treatments of the semiconductor wafers. However, a quartz jig such as a wafer boat 11 incorporates a multiplicity of constituent members bonded together by melting contacting portions thereof and hence has a rather complex configuration. Thus, it is very involved to fabricate the members in such a way that each of them has a first core layer, a second surface layer covering the first layer, and a third layer for covering the entire structure while maintaining an advantageous yet complex configuration of the boat, hence results in a very low manufacturing efficiency of the jigs.

SUMMARY OF THE INVENTION

It is, therefore, an object of the invention to provide a novel quartz jig which may effectively prevent emission of contaminating metals and at the same time has a good structure suitable for the fabrication thereof.

It is another object of the invention to provide a novel method of manufacturing a quartz jig which may effectively prevent deposition of contaminating metals and has a good structure suitable for the fabrication of silicon wafers.

In one aspect of the invention, there is provided a thermal processing jig for supporting a multiplicity of silicon wafers during manufacture of semiconductor devices, the jig comprising:

a body made from a first type of quartz having high heat resistance;

portions, adjacent to said silicon wafers, made from a second type of quartz containing a relatively small amount of metal impurities, wherein said body is separated from said silicon wafers by a predetermined distance.

In the thermal processing jig described above, the first type of quartz for the body may be electric fusion quartz, while the second type of quartz may be either oxyhydrogen flame fusion quart or synthetic quartz.

Alternatively, the first type of quartz of the jig may be oxyhydrogen flame fusion quartz and the second type of quartz may be synthetic quartz.

The body of the jig described above has high heat resistance, but can liberate a relatively large amount of contaminating metals. The portions of the jig made from the second type of quartz and brought to contact with the silicon wafer is made from quartz that can emit little contaminating metals. In addition, the body is separated from the silicon wafer, thereby preventing contamination of the silicon wafers by deposited metal impurities. It should be noted that the structure of the jig is well suited for the fabrication of the jig itself.

In a further aspect the invention, there is provided a method of manufacturing a thermal processing jig for use in processing semiconductor devices, comprising steps of:

fabricating a body of the jig from a first type of quartz having high heat resistance;

fabricating portions of the jig, adjacent to the silicon wafers, from a second type of quartz containing a relatively small amount of metal impurities;

bonding said portions and said body together by flame-melting the contacting areas of said body and said portions.

In this method, the first type of quartz may be electric fusion quartz, while the second type of quartz may be either oxyhydrogen flame fusion quartz or synthetic quartz.

Alternatively, the first type of quartz of the jig may be oxyhydrogen flame fusion quartz and the second type of quartz may be synthetic quartz.

DETAILED DESCRIPTION OF THE PREFERRED EMBODIMENTS

Figure 1:
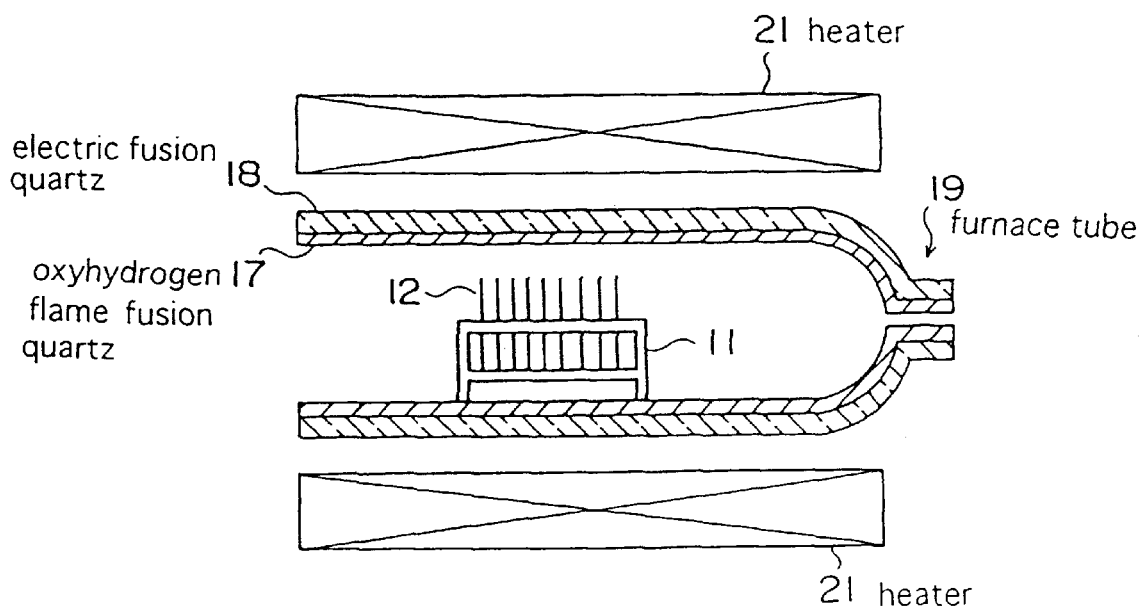
FIG. 1 is a longitudinal cross section of a prior art furnace tube.
Figures 2A, 2B:
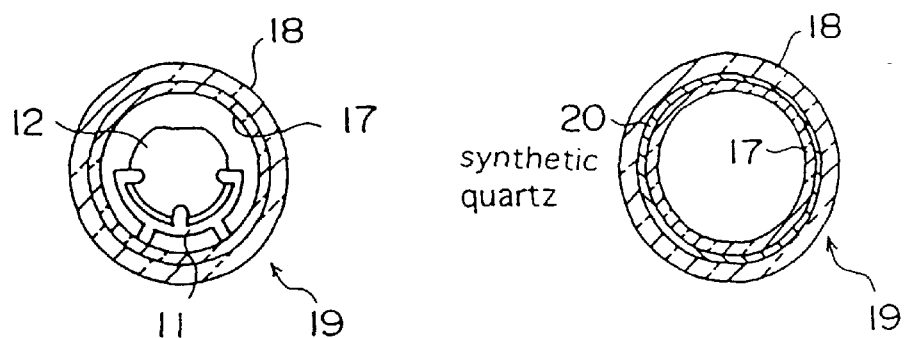
FIGS. 2A and 2B are radial cross sections useful in explaining the prior art furnace tube FIG. 1.
Figure 3:
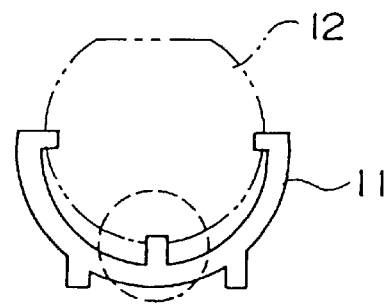
FIG. 3 is a side view of a prior art thermal processing jig.
Figure 4A:
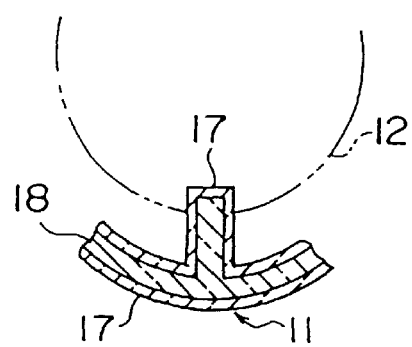
FIGS. 4A–4D are partial cross sections useful in explaining the prior art jig of FIG. 3.
Figure 4B:
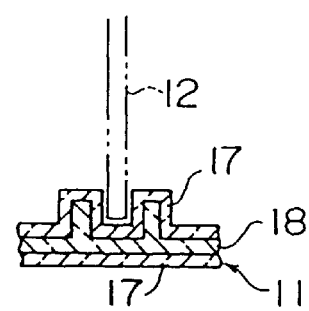
Figure 4C:
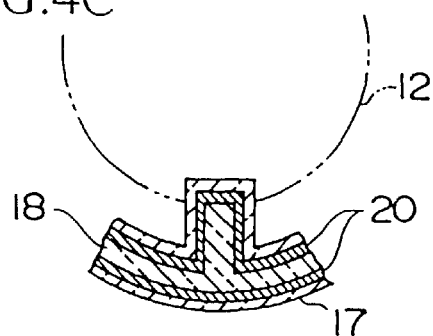
Figure 4D:
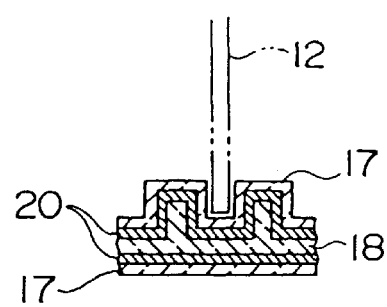

Preferred embodiments of the invention will now be described in conjunction with the accompanying drawings, in which like reference numerals indicate like or corresponding parts throughout the figures.

[Embodiments of the Thermal Processing Jigs]

Figure 5A:
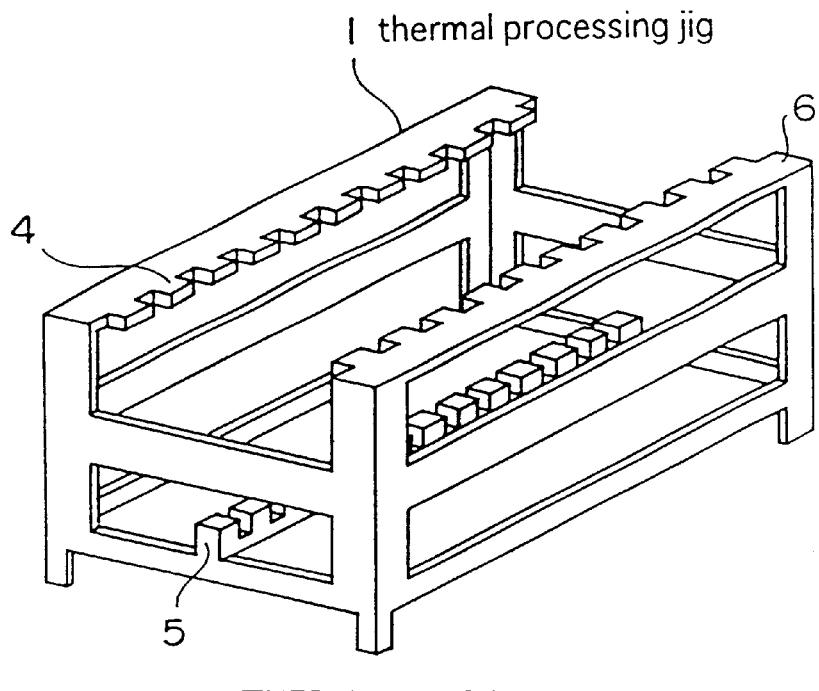
FIG. 5A is a perspective view of a thermal processing jig according to the invention for mounting thereon silicon wafers.
Figure 5B:
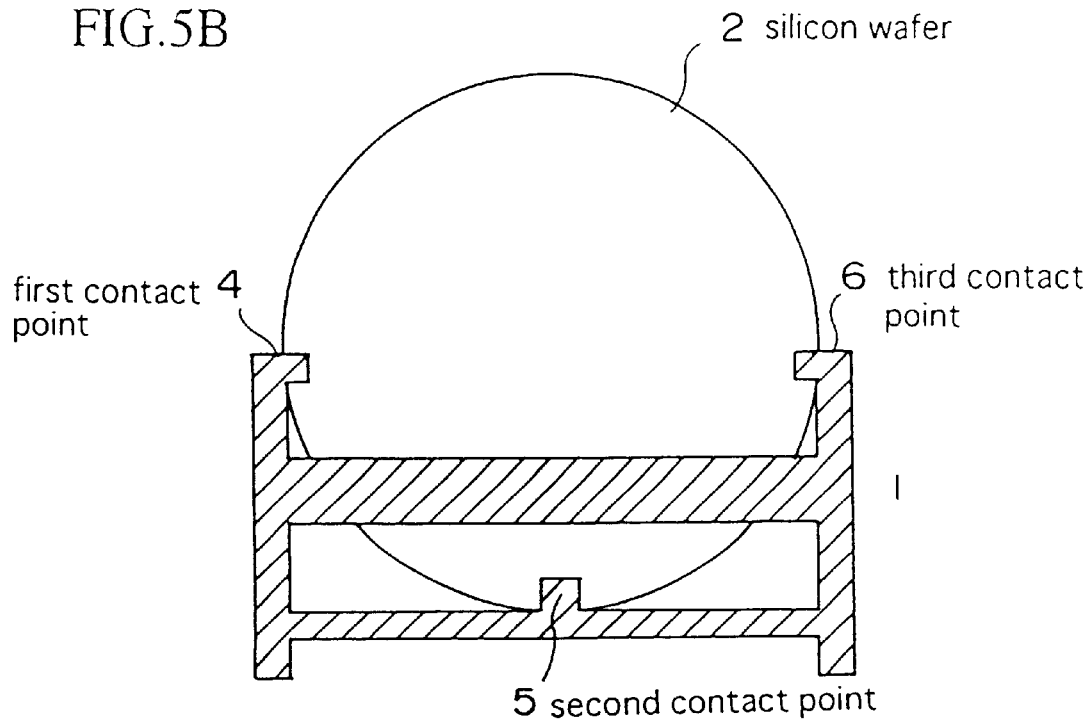
FIG. 5B is a side view of the jig shown in FIG. 1A with silicon wafers mounted thereon.

Referring now to FIG. 5A, there is shown a perspective view of a thermal processing jig 1 in accordance with the present embodiment. The thermal processing jig 1 has a generally parallelepiped skeleton, which is adapted to accommodate a lower half of each disk shaped silicon wafer or substrate 2 as shown in FIG. 5B. The silicon wafer 2 is supported at the bottom thereof as well as at the diametrically opposite sides thereof by the grooved or comb-shaped support members 4, 5, and 6 of the thermal processing jig 1. As described in connection with FIG. 1A, during a process of forming a layer on the wafer, the silicon wafer 2 is first accommodated in the thermal processing jig 1, and then the jig 1 and the silicon wafer 2 are together placed in a furnace tube 19 for heat treatment.

FIG. 5B is a side view of the section 6 of the thermal processing jig 1 accommodating therein the silicon wafer 2, which is supported by the three support members 4, 5, and 6 of the thermal processing jig 1 only at the three points.

Figure 6A:
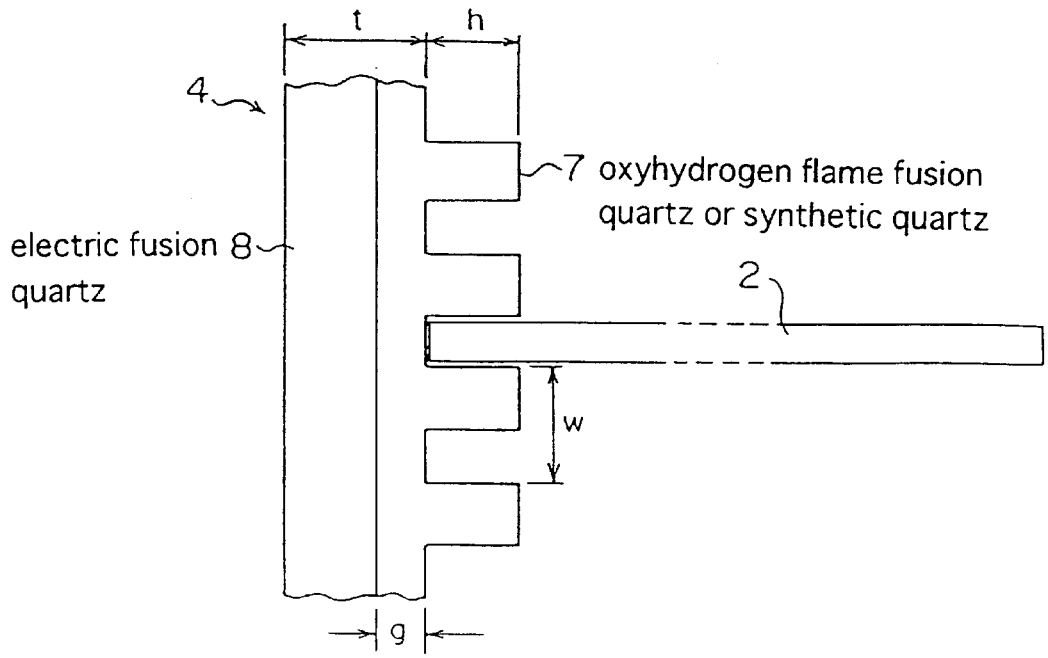
FIG. 6A–6B each are an enlarged sectional view of the thermal processing jig shown in FIGS. 5A and 5B, showing the section supporting one of the silicon wafers.
Figure 6B:
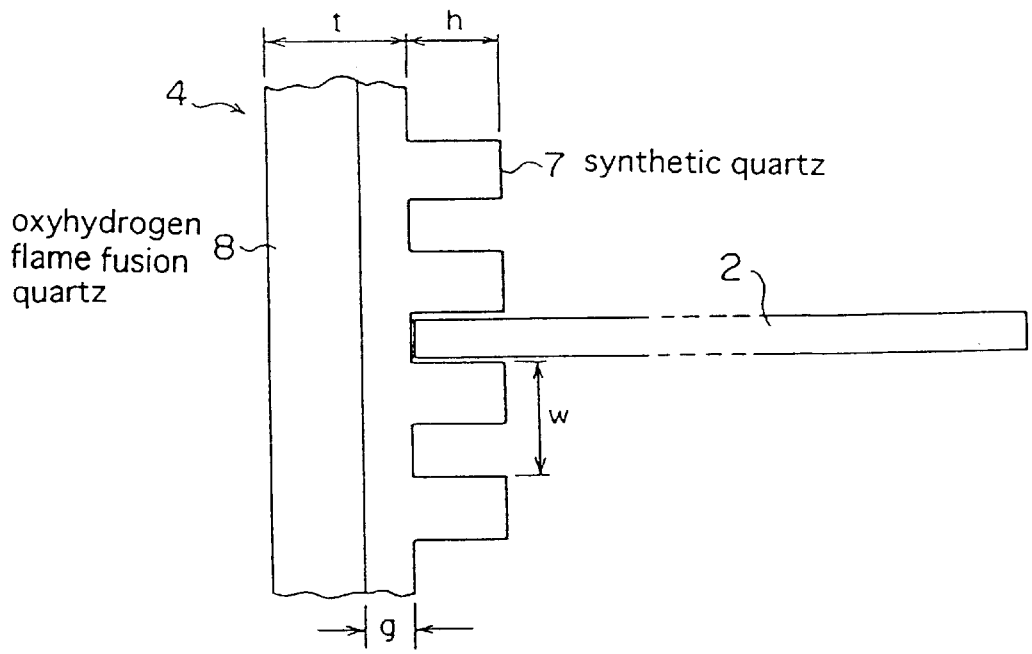
Figure 7:
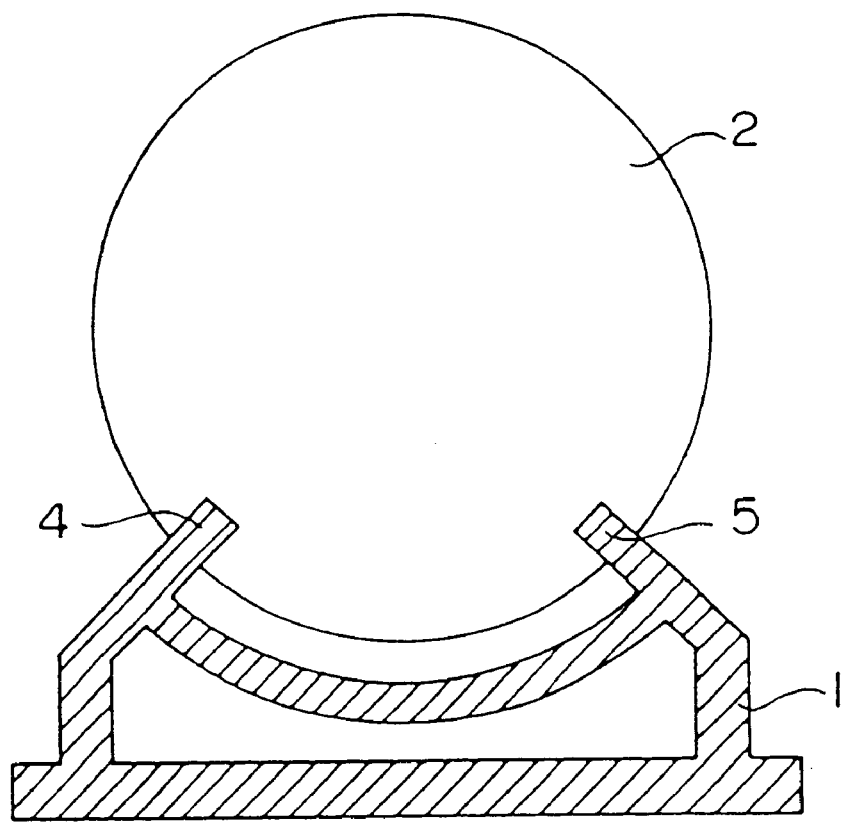
FIG. 7 is a side view of a second thermal processing jig of the invention, designed to support each of the silicon wafers at two points.

FIGS. 6A and 6B show in enlarged view the section 7 of the first support member 4 which actually comes into direct contact with the silicon wafer 2. As shown in the figures, this section 7 of the support member 4 is made from oxyhydrogen flame fusion quartz or synthetic quartz. On the other hand, the section 8 of the support member 4 which is separated from the silicon wafer 2 by a predetermined distance g is made from electric fusion quartz when the section 7 of the quartz in contact with the silicon wafer is oxyhydrogen flame fusion quartz (refer to FIG. 6A), or the section 8 is made from either oxyhydrogen flame fusion quartz or electric fusion quartz when said section 7 in contact with the silicon wafer 2 is synthetic quartz (refer to FIGS. 6A and 6B).

Thus, the combinations of the section 7 in contact with the silicon wafer and the section 8 separated from the wafer can be either one of the followings:

(1) Section 7: Oxyhydrogen flame fusion quartz—Section 8: Electric fusion quartz.

(2) Section 7: Synthetic quartz—Section 8: Electric fusion quartz.

(3) Section 7: Synthetic quartz—Section 8: Oxyhydrogen flame fusion quartz The same is true for the support members 5 and 6 shown in FIGS. 5A and 5B. The members of the thermal processing jig 1 other than the members 4, 5, and 6, are also made from electric fusion quartz.

As an example, dimensions of the thermal processing jig 1 are: h=about 5 mm; t=about 10 mm; w=about 4.5 mm; and g=about 0.6 mm.

[Investigation for Sources and Effects of Metal Contamination of Silicon Substrate]

The reason why the jig 1 is given the configuration as described above is as follows. When the present inventor has designed the jig 1, he has aimed to employ, in the body of the jig, quartz having an excellent heat resistance against thermal distortion during heat treatments of the silicon wafers 2 (that is, to employ refractory quartz containing only a minor amount of OH radicals), and at the same time employ, in the only parts of the jig for supporting the silicon wafer 2, a quartz liberating less metal impurities (that is, to employ a quartz having a negligible level of the contamination to the silicon wafer). In addition to the above, he has also aimed to provide a simple structure to the jig 1, in order to fabricate the jig itself easily Use of such two different types of fusion quartz and synthetic quartz permits prevention of metal contamination while maintaining the durable and easy-to-fabricate jig 1.

As noted previously, the inventor is concerned with the refractoriness (i.e. heat resistance against thermal deformation) as well as the purity (i.e. impurity metal content) of the quartz jig. Therefore, the inventor first examined the contents of OH radicals of such metals as iron (Fe), copper (Cu), and chromium (Cr) in quartz samples which were fused and crystallized in different ways, with the results shown in Table 1.

TABLE 1

OH RADICALS AND IMPURITY METAL CONTENTS IN QUARTZ

|  | OH Radicals (ppm) | Fe (ppb) | Cu (ppb) | Cr (ppb) |
| --- | --- | --- | --- | --- |
| Electric fusion quartz | 5.6 | 20 | 6 | 21 |
| Oxyhydrogen flame fusion quartz | 229 | 120 | 8 | <15 |
| Synthetic quartz | 105 | 12 | <4 | <4 |

It would be recalled that the heat resistance of the quartz is correlated to the amount of OH radicals therein. According to the results shown in Table 1, oxyhyrogen flame fusion quartz has a relatively large amount of OH radicals as much as 229 ppm (parts per million). On the other hand, electric fusion quartz contains an extremely low level of OH radicals, which is as low as 5.6 ppm, due to the fact that the quartz is electrically fused in vacuum. Accordingly, the electric fusion quartz has superb refratoriness and hence it is less likely to be distorted by heat compared with oxyhydrogen flame fusion and synthetic quartz which contains rich OH radicals.

Regarding the content of metal impurities, expressed in unit of parts per billion (ppb), oxyhydrogen flame fusion quartz contains 120 ppb of Fe, which is six times greater compared with the Fe content in the electric fusion quartz, and 8 ppb of Cu which is 1.3 times that of 6 ppb of copper in the electric fusion quartz. However, the content of Cr in the former quartz is less than 15 ppb or 0.7 times of 21 ppb of Cr in the latter quartz. It is noted that synthetic quartz has little metal impurities.

These two types of the quartz can liberate impurity metals such as Fe, Cu, and Cr, so that the quartz can be a potential source of metal contamination of silicon wafers when used in the thermal processing jig.

Figure 8A:
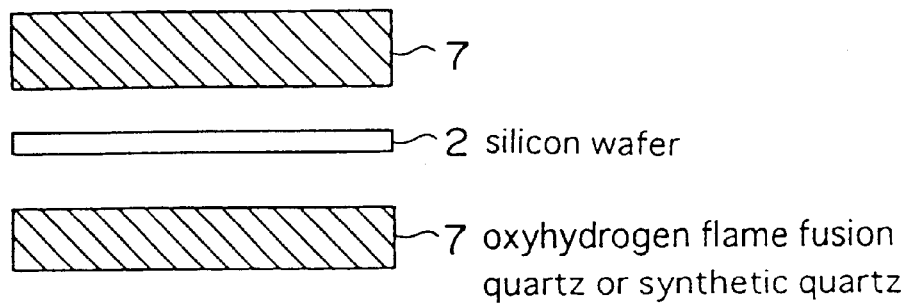
FIGS. 8A–8D are schematic views of sample specimens for use in determining the amounts of metal impurities liberated from the quartz as listed in Table 2.

Thus, the inventors conducted experiments to observe the effects of these metals on the silicon wafers, in which a set of two circular discs of either oxyhydrogen flame fusion quartz or synthetic quartz 7 and each having a thickness of 5 mm, and a silicon wafer 2 having the same dimensions as the foregoing quartz discs were prepared as shown in FIG. 8A. Similarly, using electric fusion quartz, another set of two quartz discs and a silicon wafer all having the same dimensions is prepared as shown in FIG. 8B.

Figure 8B:
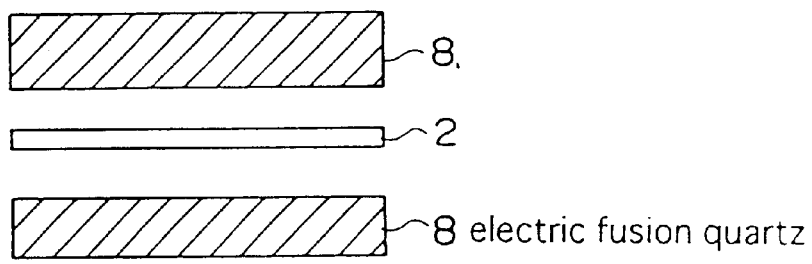
Figure 8C:
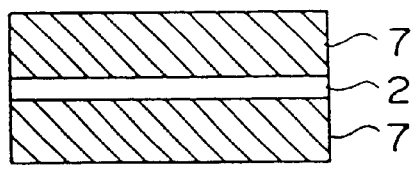
Figure 8D:
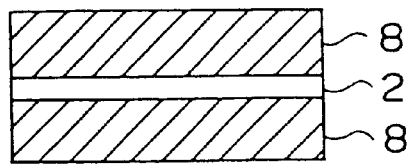

Next, as shown in FIG. 8C, two types of samples for oxyhydrogen flame fusion quartz and for synthetic quartz are prepared by sandwiching a silicon wafer sample 2 by two circular discs 7 of oxyhydrogen flame fusion quartz and by two circular discs 7 of synthetic quartz as shown in FIG. 8A, to integrate three discs, respectively Similarly, another type of specimen is formed by sandwiching a silicon wafer sample 2 of FIG. 8B with two circular quartz discs 8 of electric fusion quartz, to integrate three discs, as shown in FIG. 8D.

The oxyhydrogen flame fusion quartz and synthetic quartz samples of FIG. 8C and the electric fusion quartz sample of FIG. 8D are then heated to a temperature of 1,100° C. for six hours.

After the heating, the samples are disintegrated to separate the silicon wafers from the respective quartz discs for examination of the impurity metals liberated from the contacting quartz discs 7 and 8 of oxyhydrogen flame fusion quartz or synthetic quartz, and electric fusion quartz, respectively, and adsorbed by the wafers. The amounts of the impurity metals adsorbed on the surface of each silicon wafer is determined by atomic absorption spectroscopy. Table 2 shows the results of the measurements.

TABLE 2

IMPURITY METALS LIBERATED FROM QUARTZ AND ADSORBED BY SILICON WAFER

|  | Fe | Cu | Cr |
|---|---|---|---|
| Electric fusion quartz | 560 | 1000 | 3100 |
| Oxyhydrogen flame fusion quartz | <4 | 57 | <0.87 |
| Synthetic quartz | <2.5 | 41 | <0.84 |

(In unit of ×10$^{10}$ atoms/cm$^2$)

It is seen from Table 2 that the amounts of Fe, Cu, and Cr emitted from the oxyhydrogen flame fusion quartz and synthetic quartz are: less than 4 ppb and 2.5 ppb; 57 ppb and 41 ppb; and less than 0.87 ppb and 0.84 ppb, respectively, while the corresponding amounts of Fe, Cu, and Cr deposited by the electric fusion quartz are exceedingly larger, amounting to 560 ppb, 1000 ppb, and 3100 ppb, respectively, which are in ratio about 140–120 times, about 17.5–24 times, and about 3560–3690 times larger, respectively, than the oxyhydrogen flame fusion quartz and synthetic quartz.

It should be noted, however, that the results shown in Table 2 applies to the cases where the silicon wafer is in direct contact with the electric fusion quartz liberating the impurity metals. Advantageously, deposition of the impurity metals can be reduced to a negligible level if the electric fusion quartz is spaced apart from the silicon wafer. To see this, deposition of the impurity metals were also measured for quartz discs positioned at a predetermined distance g from the silicon wafer 2.

Figure 9A:
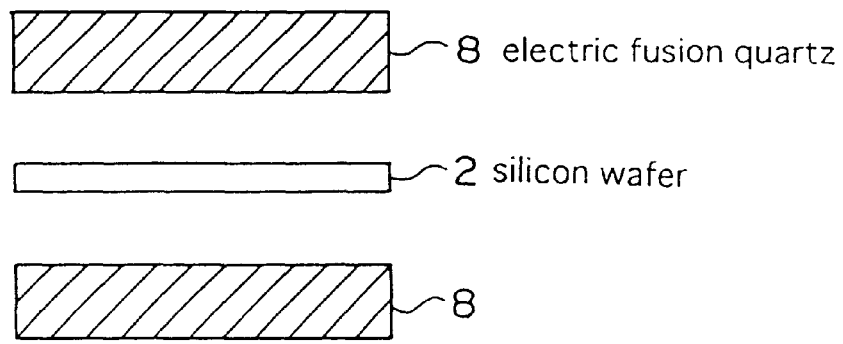
FIGS. 9A and 9B are schematic views of samples specimens for use in determining the amounts of metal impurities liberated from the quartz as listed in Table 3 and deposited onto sample specimens, with and without spaces between the quartz and the sample specimens.
Figure 9B:
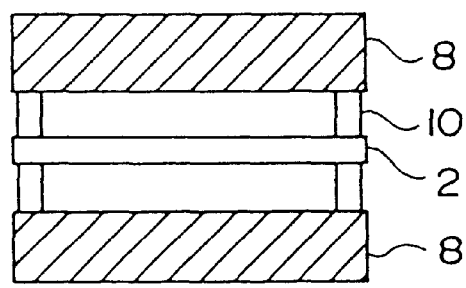

Table 3 shows the result of such test conducted for a set of two circular discs 8 of electric fusion quartz having a thickness of 5 mm, and a silicon wafer 2, as shown in FIG. 9A. The quartz discs are disposed on the opposite sides of the silicon wafer, spaced apart therefrom by small pieces 10 of silicon wafers on the opposite sides, as shown in FIG. 9B. Thus, in this instance the distance g is equal to the thickness of the silicon wafer 2, thus it is 0.6 mm.

As a control sample representing a case for g=0, a set of two circular discs 8 of electric fusion quartz having a thickness of 5 mm and a circular silicon wafer 2 is prepared, as shown in FIG. 8B. The two quartz discs 8 on the opposite sides of the silicon wafer were positioned in direct contact therewith, as shown in FIG. 8D.

The samples were heated at 1,100° C. for six hours, and then subjected to atomic absorption spectroscopy to measure the amounts of impurity metals emitted from different quartz samples, one in contact with and another spaced apart from the silicon wafers. The results are shown in Table 3.

TABLE 3

IMPURITY METALS LIBERATED FROM QUARTZ AND ADSORBED BY SILICON WAFER

|  | Fe | Cr | Ni |
|---|---|---|---|
| In contact (g = 0 mm) | 57 | 55 | 270 |
| Spaced (g = 0.6 mm) | 8.7 | 2.5 | 5.3 |

(In unit of ×10$^{10}$ atoms/cm$^2$)

It is seen from this Table that if the electric fusion quartz is positioned away from the silicon wafer by 0.6 mm, the amounts of impurity metals Fe, Cr, and Ni emitted from the electric fusion quartz and adsorbed by the silicon wafer 2 can be reduced from 57 to 8.7, from 55 to 2.5, and from 270 to 5.3, respectively, in unit of ×10$^{10}$ atoms/cm$^2$, amounting to reduction by about 85%, 95%, and 98%, respectively, as compared to the case where the quartz is in contact with the silicon wafer. From this result, it can be said the contamination caused by the electric fusion quartz may be reduced substantially to a negligible level by separating the quartz from the silicon wafer 2 by a distance of as much as 0.6 mm.

The reader might have noted that the levels of the impurity metals in the electric fusion quartz as shown in Tables 2 and 3 are not in accord. This is because the levels of metals contained in the quartz samples listed in these Tables were different, due to the fact that the two tests were performed at two different occasions for different purposes using different quartz materials purchased from different two venders. However, it should be understood that the Tables 2 and 3 respectively indicate a general tendency that spacing between the quartz discs and the silicon wafer allows for the reduction of the impurity metals deposited on the silicon wafer even when the quartz contains substantial amounts of impurity metals.

Conclusions obtained from the results of Tables 1–3 may be summarized as follows.

(1) Electric fusion quartz contains little OH radicals, and has high heat resistance, exhibiting little deformability at high temperatures (Table 1).

(2) Oxyhydrogen flame fusion quartz also contains a relatively large amount of impurity metals as compared with electric fusion quartz, and can emit potential hazardous metal impurities when used in a thermal processing jig (Table 1).

(3) However, electric fusion quartz liberates a great amount of impurity metals at temperatures as high as 1,100° C. (Table 2). In other words, the amount of impurity metals emitted from quartz and deposited on a silicon wafer is not proportional to the inherent amounts of the impurity metals in the quartz. Therefore, if a silicon wafer in contact to a jig made from electric fusion quartz is thermally processed, such contact portion of the silicon wafer will be contaminated with a great amount of impurity metals emitted from electric fusion quartz. It is well known that a semiconductor made from a silicon wafer contaminated with impurity metals has a shortened carrier life-time, thereby exerting a bad influence to the performance of a semiconductor.

(4) The amounts of impurity metals deposited on the silicon wafer 2, and hence the contamination of the silicon wafer, caused by electric fusion quartz may be drastically reduced by separating the contaminating quartz away from the silicon wafer 2 during a heat treatment (Table 3). Also, electric fusion quartz has high heat resistance, exhibiting little deformability at high temperatures (Table 1).

(5) As previously described, there can be three different combinations of the first and the second quartz members.

That is, the second quartz member 7 can be oxyhydrogen flame fusion quartz and synthetic quartz when the first quartz member 8 is electric fusion quartz, and the second quartz member 7 can be electric flame fusion quartz when the first quartz member 8 is oxyhydrogen flame fusion quartz.

The third combination of the quartz members as described above can be a satisfactory candidate for the quartz thermal processing jig usable at a processing temperature lower than currently used temperatures. For example, when the first quartz 8 is oxyhydrogen flame fusion quartz, the second quartz 7 can be synthetic quartz, instead of electric fusion quartz that liberates a relatively large amounts of impurity atoms, if the processing temperature does not exceeds 1,0500° C.

It should be remembered, however, that synthetic quartz does not have sufficient heat resistance if it is used alone. Hence it is desirable to use synthetic quartz in combination with oxyhydrogen flame fusion quartz for a thermal processing jig. In addition, such combination will provide a thermal processing jig which is much less contaminating to the silicon wafer as compared with the thermal processing jig which is solely made from oxyhydrogen flame fusion quartz.

[Method of Fabricating a Thermal Jig]

A method of fabricating a thermal processing jig 1 as shown in FIG. 5 will now be described briefly. The main body of the thermal processing jig 1 is formed from electric fusion quartz using any of known fabrication techniques. Sections 7 of the support members 4, 5, and 6, that will come into contact with silicon wafers 2, are formed using oxyhydrogen flame fusion quartz or synthetic quartz, and the rest sections of the support members are formed using electric fusion quartz, separately. Then they are flame welded together. The main body and the support members are also flame welded together.

Having a structure as described above, a thermal processing jig of the invention may be fabricated much easier than conventional jigs having a core member of electric fusion quartz and a surface layer of oxyhydrogen flame fusion quartz or synthetic quartz.

ALTERNATIVE EXAMPLE

The invention is not limited to the embodiments explicitly described above. For example, jig material is not limited to quartz. It can be any appropriate jig material such as silicon carbide (SiC) used in making conventional thermal processing jigs.

A first essential feature of the invention is to select a first jig material for the body of the jig having good heat resistance, as described in connection with Table 1. A second essential feature of the invention is to select a second jig material for support members of the jig which liberates only negligible amount of impurity metals when in contact with silicon wafers during a heat treatment thereof. A third essential feature of the invention is to determine a minimum distance g between the silicon wafer and the jig body to prevent metal contamination of the silicon wafer caused by the first material during the heat treatment, as described in connection with Table 3. A fourth essential feature of the invention is to fabricate those sections of the support members that come within the distance g from a silicon wafer with the second jig material, and to fabricate the rest of the jig with the first jig material.

Consequently, a jig having excellent heat resistance and yet exhibiting much less contaminant to silicon wafers may be provided by the invention.

The distance g between the silicon wafer 2 and the second member 8 of electric fusion quartz is not limited to 0.6 mm, since it depends on various design parameters including, for example, types of jig materials and the configuration of the jig as well as the types of the semiconductor devices. In any case, an optimal distance g may be determined in a manner as described in connection with Table 3.

The configuration of the jig is not limited to one having three support members as shown in FIG. 8. For example, the invention may be applied to a jig having only two support members. It will be readily understood by a person skilled in the art that the invention may be applied to any known configuration of a conventional thermal processing jig.

ADVANTAGES OF THE INVENTION

The invention may provide a novel quartz jig which may effectively prevent deposition of contaminating metals on semiconductor devices under a heat treatment, and has a suitable structure for easy fabrication thereof.

The invention may also provide a novel method of manufacturing such quartz jig.

What is claimed is:

1. A thermal processing jig for supporting a plurality of silicon wafers during manufacturing processes of semiconductor devices, said jig including:
   a main body; and
   a supporting section supporting silicon wafers, said supporting section partially formed on
   a part of said main body;
      the improvement comprising;
      said main body made of a first type of quartz; and
      the entire supporting section made of a second type of quartz;
      said second type of quartz liberating a smaller amount of metal impurities into said silicon wafers than said first type of quartz, and said first type of quartz having a higher heat resistance than said second type of quartz.

2. The thermal processing jig according to claim 1, wherein
   said silicon wafers are away from said first type of quartz at least at a distance which is sufficient to prevent the contamination of said silicon wafers by said impurity metals.

3. The thermal processing jig according to claim 2, wherein
   said distance between said silicon wafers and said first type of quartz is determined based on the specifications of said semiconductor devices and processing temperatures for said semiconductor devices.

4. The thermal processing jig according to claim 3, wherein
   said distance between said silicon wafers and said first type of quartz is bout 0.6 mm.

5. The thermal processing jig according to claim 2, wherein
   said distance between said silicon wafers and said first type of quartz is approximately the same as the thickness of said silicon wafers.

6. The thermal processing jig according to claim 1, wherein
   said first type of quartz is electric fusion quartz; and
   said second type of quartz is a material selected from the group comprising of oxyhydrogen flame fusion quartz and synthetic quartz.

7. The thermal processing jig according to claim 1, wherein said first type of quartz is oxyhydrogen flame fusion quartz; and said second type of quartz is synthetic quartz.

8. A thermal processing jig for supporting a plurality of silicon wafers during manufacturing processes of semiconductor devices, said jig including:

a main body; and a supporting section supporting silicon wafers, said supporting section partially formed on a part of said main body;

the improvement comprising;

said main body made of a first type of quartz; and the entire supporting section made of a second type of quartz, a distance g between said first type of quartz and said silicon wafers corresponding to a thickness of said silicon wafers or more;

said second type of quartz liberating a smaller amount of metal impurities into said silicon wafer than said first type of quartz and said first type of quartz having a higher heat resistance than said second type of quartz.

9. The thermal processing jig according to claim 8, wherein said first type of quartz is electric fusion quartz; and said second type of quartz is a material selected from the group comprising of oxyhydrogen flame fusion quartz and synthetic quartz.

10. The thermal processing jig according to claim 8, wherein said first type of quartz is oxyhydrogen flame fusion quartz; and said second type of quartz is synthetic quartz.

\* \* \* \* \*